United States Patent [19]

Culley et al.

[11] Patent Number: 4,999,805

[45] Date of Patent: Mar. 12, 1991

[54] EXTENDED INPUT/OUTPUT CIRCUIT BOARD ADDRESSING SYSTEM

[75] Inventors: Paul R. Culley, Cypress; Montgomery McGraw, Spring, both of Tex.

[73] Assignee: Compaq Computer Corporation, Houston, Tex.

[21] Appl. No.: 242,728

[22] Filed: Sep. 9, 1988

[51] Int. Cl.$^5$ .............................................. G06F 12/00
[52] U.S. Cl. .................................. 364/900; 364/929.4; 364/929.5; 364/957.2; 364/955; 364/961.1; 364/958.5
[58] Field of Search .............................. 364/200, 900

[56] References Cited

U.S. PATENT DOCUMENTS 4,249,240  2/1981  Barnich ................................ 364/200
4,485,457  11/1984  Balaska et al. ...................... 364/900

OTHER PUBLICATIONS

Apple Computer, Inc., Designing Cards and Drivers for MacIntosh II and MacIntosh SE, 1987, pp. 4-2 to 4-6.

IBM Corp., Personal Computer at Technical Reference, Sep. 1985, pp. 1-24 to 1-38.

IBM Corp., Personal System/2 Model 80 Technical Reference, First Edition, Apr. 1987, pp. 2-29, 2-43 to 2-51.

Primary Examiner—Eddie P. Chan
Assistant Examiner—Paul Kulik
Attorney, Agent, or Firm—Pravel, Gambrell, Hewitt, Kimball & Krieger

[57] ABSTRACT

An extended addressing system for allowing use of existing circuit boards but obtaining more address space is disclosed. If given bits in the address value indicate that a former system board address is being presented previously unutilized higher order bits are used as a slot identifier that slot's AEN signal is made low, while all the remaining AEN signals to each slot are made high to disable operation. All the AEN lines remain low as an existing circuit board address is presented or a memory operation is occurring. All the AEN lines go high during a DMA operation.

13 Claims, 2 Drawing Sheets

EXTENDED INPUT/OUTPUT CIRCUIT BOARD ADDRESSING SYSTEM

BACKGROUND OF THE INVENTION

1. Field of the Invention

This invention relates to interchangeable circuit board addressing systems for computer systems, and more particularly, to extended yet backwardly compatible circuit board addressing systems.

2. Discussion of the Prior Art

Microprocessors and the personal computers which utilize them have become more powerful in recent years. Microprocessors having word sizes of 32 bits are now available. In the past 8 bits was conventional. Sixteen bit capacity only recently became widely available in personal computers.

Concomitantly with the growth in power of microprocessors, new uses for personal computer systems have arisen. The uses are varied and, as a result, have different requirements for the various subsystems forming the complete computer system. For example, personal computers used primarily for word processing have relatively modest requirements for installed memory and processor subsystems, have very high performance requirements for the mass storage subsystem and have varying requirements for the display subsystem, depending on the exact application, such as high resolution desk-top publishing or simple letter production, being performed. A data storage and retrieval-oriented system needs larger amounts of memory, a faster processor, may have lesser mass storage requirements and generally has minimal display requirements. Complex spread-sheet applications require very large amounts of memory, high performance processors, average capability mass storage subsystems and have display requirements which vary depending on whether complex graphic presentations are desired. Simple spread-sheet applications need standard amounts of memory, average performance processors, average capability mass storage subsystems and have the same display requirements as complex spread-sheet applications. Computer automated design systems require a large amount of memory, very high performance processors, high performance mass storage systems and very high performance display components.

As illustrated above, while the varying requirements for subsystems that form the complete personal computer system dictate variety, economies of volume production require manufacturing a personal computer system with as many common features as possible. This tension between variety and uniformity has resolved itself in personal computer systems through the development of basic units that vary only processor performance levels. Further inclusion of interchangeable subsystem modules is the means used by the customer to achieve variety. For instance, a basic personal computer unit is likely to contain a power supply, provisions for physically mounting various mass storage devices and a system board incorporating a microprocessor, microprocessor-related circuitry, connectors for receiving circuit boards containing other subsystems, circuitry related to interfacing the circuit boards to the microprocessor, and in some instances, memory. The use of connectors and interchangeable circuit boards allows users to install subsystems of the desired capability.

The use of interchangeable circuit boards has necessitated the development of an interface bus standard. An interface bus standard permits subsystems to be designed so that problems do not result from incompatible decisions made either by personal computer unit designers or circuit board designers. The use of interchangeable circuit boards and an interface standard, commonly called a bus specification, was incorporated into the original International Business Machine Corporation (IBM) personal computer, the IBM PC.

As mentioned initially and as has become inevitable in the computer and electronics industry, the capabilities of personal computer components have increased dramatically. Memory component prices have dropped and capacities increased. Performance rates and capacities of mass storage subsystems have increased, generally by the incorporation of hard disk units for the previous floppy disk units. Video processor technology has improved so that high resolution color systems are reasonably affordable. These developments strain the capabilities of existing IBM compatible personal computers systems. In particular, software and hardware configuration problems become evident in the devices which attempt to utilize the input/output space available with the Intel Corporation 8088, 8086, 80286, and 80386 microprocessors together with the IBM PC standards.

It has become commonplace for a user to desire to upgrade the user's original input/output subsystems as well as to add new input/output devices in connection with the bigger and faster microprocessors. The user desires to upgrade and improve input/output subsystems without replacing the user's existing application programs or present input/output devices and controllers. Both existing applications programs and present input/output devices represent a significant investment in time and money to the user. Furthermore, users prefer not having to install input/output controller boards into specific system board slots.

Implementing the user's desire to upgrade and improve the user's input/output systems is further complicated by the interface bus standard for use with computer systems related to or compatible with products produced by IBM. That interface bus has evolved through a complicated expansion path resulting from the need to overcome limitations of earlier processors, operating systems and designs. A present crucial limitation of the prior art IBM interface bus standard is that the interface bus standard limits addressing the input/output space of the circuit boards to ten bits of address space. One fourth of that space (the condition where the two most significant bits are zero) has been preserved for use by the system board and is not available to the input/output circuit boards. Hence, only a very limited amount of input/output space is available. Over time and based on usage, portions of this address area have been reserved for particular input/output devices and their controllers. The remaining amount of input/output space is limited. The remaining allocable input/output circuit board address space in IBM PC and PC compatible systems is saturated by existing input/output devices. There is insufficient address space to allocate to new advanced input/output devices and controllers that can use the size and speed of new microprocessors to advantage. Integrating a variety of new and sophisticated input/output devices and control boards with their new applications programs, well suited to the new high speed microprocessors, into a system that can still fully utilize existing input/output devices and application programs has become extremely difficult.

The above difficulty results because under the IBM conventional system input/output circuit boards know when they are addressed by decoding no more than ten bits of an input/output address word communicated through a common bus. Knowledge of its own allocated address locations within the address space defined by ten bits is fixed in the circuit boards. E.g., the circuit board knows if it is addressed when some upper bit subset of the input/output address word corresponds with a fixed code.

It would be futile with the existing system, without more, to allocate more bits to the input/output address space to extend in this manner the addressing space available. Existing boards do not decode those higher bits spaces. Thus, existing boards, ignorant of the higher bits content, might interfere with the new boards attempting to utilize this extended input/output space (an effect referred to as "mirroring").

Of course, users could discard all existing circuit boards and their application programs and convert to new boards and new programs. However, significant amounts of user energy, time and money has been expended in developing and procuring the existing circuit boards and programs. It is a goal of the present invention to provide a standard addressing system that provides for the continued use of the existing input/output devices, circuit boards and application programs.

Therefore, it is desirable to provide an addressing system for IBM compatible personal computer systems that takes advantage of the enhanced memory and processor speed and size made possible by recent advances in the computer and electronics fields while preserving the capacity to utilize existing input/output devices, circuit boards and applications programs together with additional novel input/output devices, circuit boards and application programs.

SUMMARY OF THE INVENTION

The addressing system of the present invention allows a computer system to use existing circuit boards and yet provides additional addressing space for new circuit boards fully utilizing the addressing system.

While previously when the A8 and A9 address bits were zero during an input/output space operation, system board devices were addressed, in the new addressing system when these bits are both zero, the A12–A15 bits are used to determine the specific slot or location which is being addressed. The zero slot is assigned to the system board for compatibility reasons. When the A8 and A9 bits are zero and during an input/output space operation and the slot is being addressed, its AEN line is low, with the individual AEN line to each of the other slots being high to disable operation of any additional installed circuit boards.

To allow use of existing circuit boards, the addressing system of the present invention sets the AEN lines low if either the A8 or A9 address bit is a one and an input/output space operation is occurring. Additionally, the AEN lines are low during memory space operations and high during direct memory access operations to conform to the current standard.

Thus the addressing system of the present invention allows the full use of existing circuit boards and yet provides additional, non-conflicting space for new applications.

DETAILED DESCRIPTION OF THE PREFERRED EMBODIMENT

The following disclosures are hereby incorporated by reference:

U.S. application Ser. No. 243,327, entitled "Multiple Word Size Compuler Interface with Master Capabilities" by Paul R. Culley, filed on Sep. 9, 1988;

U.S. application Ser. No. 243,480, entitled "Computer System with High Speed Data Transfer Capabilities" by Paul R. Culley, filed on Sep. 9, 1988;

U.S. application Ser. No. 242,954, entitled "Programmable Interrupt Controller" by Paul R. Culley, and Montgomery McGraw, Karl N. Walker and Lazaro D. Perez, filed on Sep. 9, 1988; and U.S. application Ser. No. 242,734, entitled "Method and Apparatus for Configuration of Computer System and Circuit Boards" by Curtis R. Jones, Jr., Robert S. Gready, Roberta A. Walton and Scott C. Farrand, filed on Sep. 9, 1988, all of which are assigned to the assignee of this invention.

Figure 1:
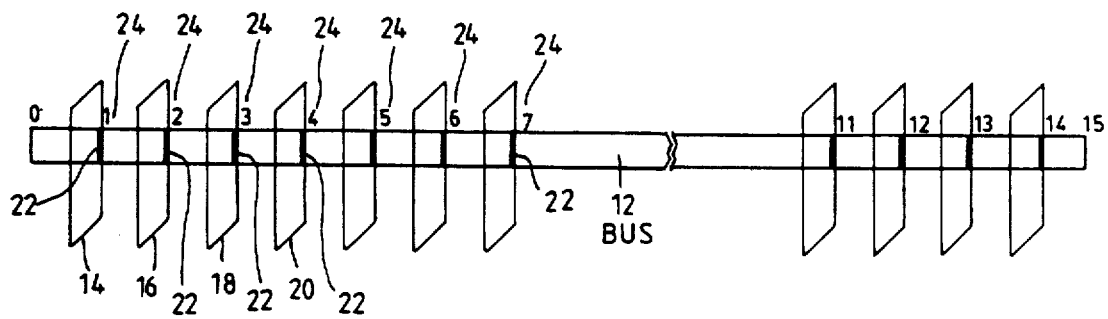
FIG. 1 is a partial representation of a computer system showing interchangeable circuit boards and locations.

FIG. 1 exhibits in a representational fashion the interrelationship of common bus 12 with circuit boards 14, 16, 18, 20, etc. installed in a computer system in arbitrary slot locations 22 having slot designations 24. The slot locations illustrated range from 0 to 15 with circuit boards being located in slots 1 through 14.

Figure 2A:
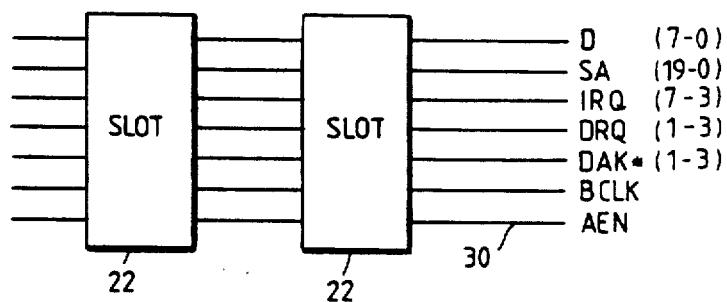
FIG. 2A is a diagram illustrating portions of the connectors and signals of the computer system according to the prior art.
Figure 2B:
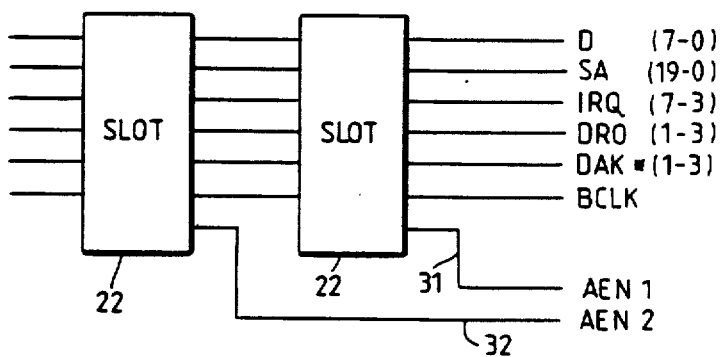
FIG. 2B is a diagram illustrating similar portions of the connectors and signals of a computer system according to the present invention.

FIG. 2A illustrates by diagram portions of the connector and signal system that is utilized in IBM PC compatible computer systems according to the prior art. Seven connectors and signals are illustrated. They conventionally comprise part of the system's common bus. FIG. 2B illustrates similar portions of the connector and signal system according to the present invention. In FIG. 2A, under the prior art, the AEN line is communicated to all circuit boards through the common bus. Under the present invention the AEN line is moved from the common bus and made into slot specific lines AEN2 (line 31), AEN2 (line 32), etc., up to as many AEN lines as there are circuit board locations, with AEN0 generally reserved for use by the system board. In the case of the embodiment shown, there are 16 circuit board locations and 16 AEN lines. Each slot specific AEN line is not conveyed to all circuit boards through the common bus. Rather, each slot specific AEN line connects only to the circuit board configured in a specific slot.

Figure 3:
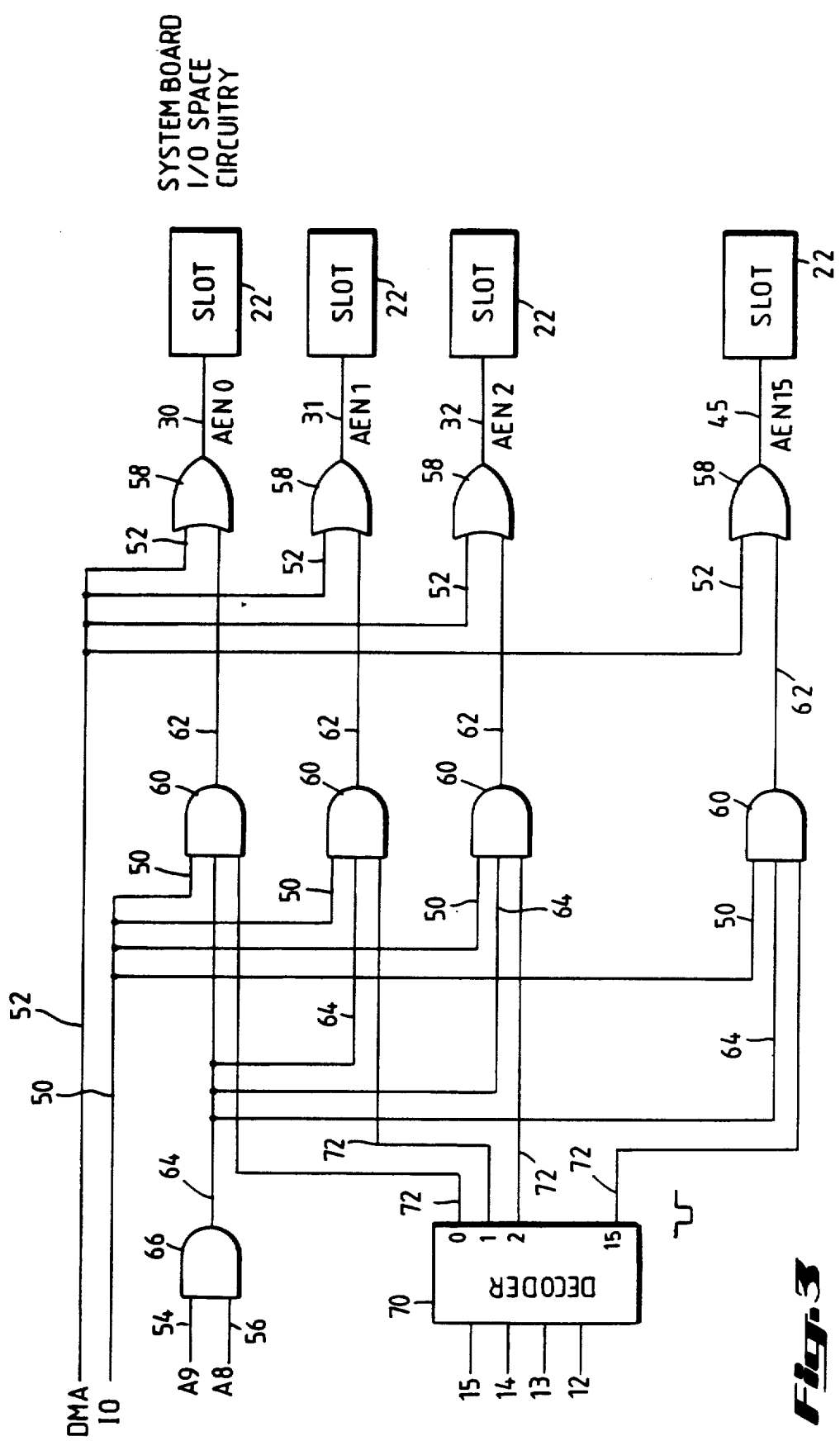
FIG. 3 is a block diagram of circuitry for implementing the present invention in a computer system.

The utility of the arrangement of the slot specific AEN lines above is illustrated more fully by the logic of FIG. 3. The circuit drawn in FIG. 3 executes illustratively for the present invention the below four logical statements:

(1) If DMA high, then AEN high.

(2) If memory space operation, then AEN low.

(3) If input/output space operation & (A8 or A9 high), then AEN low.

(4) If input/output space operation & both A8 & A9 low, then use A15-A12 to determine one $AEN_n$ low; the other $AEN_n$ high.

DMA refers to the state of a signal indicating that a direct memory access (DMA) operation is in progress. During a DMA operation, information is passed directly over the bus between an input/output space location or port and a memory space location. Therefore the input/output space control signals must be active, but memory addressing information is presented on the address lines, so the AEN signal has been and continues to be used to disable interpretation of the address signals by all devices using the input/output space except the DMA requesting device, which device ignores the AEN signal. A8, A9 and A12-A15 refer to the specific bits in the address value.

As will be illustrated below, operation based on the four logical statements maintains the compatibility of the extended addressing system of the present system with the prior art addressing system while permitting new input/output circuit boards to be designed to utilize the extended address space.

The first two logical sentences, "if DMA high then AEN high" and "if memory space operation, then AEN low," are specifications of the prior art for the AEN line that are continued in the present invention for compatibility reasons. It can be seen from an inspection of FIG. 3 that if the DMA signal carried on lines 52 to one input of a series of two input OR gates 58 is high, the output of the OR gates 58, which produce the slot specific AEN signals in the preferred embodiment, are all high. This meets the requirements of the first logical statement.

It is a system characteristic that if a memory operation is taking place, then the I/O signal carried on line 50 is low and the DMA line 52 is low because the direct memory access controller is not operating the bus. This input/output signal is provided as one input to a series of three input AND gates 60, whose outputs are connected to the second input of the OR gates 58. Thus, when the I/O signal on line 50 is low, the output of the AND gates 60 on lines 62 is low. A low signal on lines 62 and line 52 causes the output of the OR gates 58 on lines 30, 31, . . . 45 to be low, meeting the requirements of the second logical statement. Hence it can be seen that the present invention ensures that the logic for the AEN lines of the prior art specifications, as related in the above first two logical statements is maintained.

According to the specifications of the prior art, the AEN line is to remain low whenever a DMA operation was not occurring. Thus, the AEN line would remain low when the DMA signal was low, regardless of whether the signal indicated a memory operation or an input/output operation was taking place. The present invention varies the non-DMA, non-memory space meaning of the AEN signal. According to the standard which has developed for IBM PC compatible computers, the system board has occupied the input/output space from 000 to 0FF, while the interchangable circuit boards have utilized the input/output space from 100 to 3FF. The space from 400 to FFFF has been unoccupied because this is the mirror space which develops because the existing units only decode the lowest ten bits of the input/output space address A9-A0. Because it is desired that existing circuit boards can be inserted into any location and operate without any changes, the third logical statement is implemented by supplying the inverted A8 and A9 signals to a two input AND gate 66 used to determine if an existing circuit board is being addressed. The output of this AND gate 66 goes high only when the A8 and A9 signals are low and at all other times the output is low. The output 64 of the existing circuit board AND gate 66 is connected to one input of each of the AND gates 60 so that a low signal is provided on the outputs of the AND gates 60, meeting the requirements of the third logical statement.

To understand the fourth logical statement, it is necessary to discuss the address information available from the commonly used microprocessors and over the bus. In the Intel 8086, 80286, 80386 family of microprocessors, 16 bits of addressing information is available for use with the input/output space. Let these 16 bits be called A15 to A0. Input/output circuit boards for personal computers compatible with IBM PC's have historically been designed, however, to respond only to the lower 10 bits, A9-A0, of this address word. The present invention assumes that existing circuit boards continue to interpret only these 10 bits. New circuit boards utilizing the expanded input/output address space according to this invention may interpret the lower 10 to 12 bits, depending on the space needed and other design considerations.

As mentioned, when both the A8 and A9 address signals are zero, the system board has customarily considered that input/output space devices on the system board were addressed and other existing circuit boards considered that they were not addressed. Because the connectors into which the circuit boards are inserted are also located on the system board, this provides the opportunity to utilize the previous system board address values in combination with previously unutilized address bits.

The present invention utilizes previously unutilized bits in the address word. The preferred embodiment utilizes the previously unutilized top four bits of the address word, bits A15 through A12, to encode a specific slot location among the slot locations available in the computer system for configuring a circuit board. The value of such utilization will appear.

According to the present invention, when the A8 and A9 address values are low, the upper four bits of the sixteen bit address word are used to decode a specific slot or location and set that slot's AEN signal low. The remaining AEN signals are set high, disabling operation of the circuit boards in the other slots. This operation is performed by supplying the A15-A12 signals to the selector inputs of a 4 to 16 decoder device 70. When a particular value is presented at the selector inputs of the decoder 70, an output line corresponding to the binary value of the input value is brought low, with the remaining 15 output lines being at a high state. The respective output lines 72 are connected to the third input of each of the respective AND gates 60, so that the selected AND gate 60 has a low output and that AEN signal is low, assuming of course that a DMA operation is not in progress. The remaining decoder output lines have high values, so that if the A8 and A9 signals are low and an input/output operation is in progress, the output of those AND gates 60 is a high level, thus causing the respective AENn signals to be at a high or disabling state.

Using this invention the system board input/output circuitry is assumed to be in slot zero, as shown in FIG. 3, so that the full address for previous system board devices remains unchanged. A new circuit board, i.e., a circuit board designed to operate under the expanded addressing system of the invention, configured in the slot whose AEN line is enabled, is in position to respond to the address word presented on the common bus. Such new circuit board, in contrast to previously existing circuit boards, is designed to consider itself addressed where the A9 and A8 signals are zero and the slot specific AEN signal is low. All boards in other slot locations, including the system board's own input/output space circuitry located in slot zero, are disabled in order to prevent interference with the operation of the circuit board located in the coded slot. Thus the fourth logical statement is met and new input/output spaces are available for use while maintaining compatibility with existing circuit boards.

It is to be noted that the address lines A10 and A11 have not been discussed or utilized in the slot specific encoding method, but the high order four bits were utilized. This use of the high order bits allows the A10 and A11 lines to be utilized by new circuit boards designed to utilize this slot specific addressing technique. Thus the system board receives an additional three groups of 256 bytes at locations 0400–04FF, 0800–08FF and 0C00–0CFF for system usage. The new circuit boards each obtain 1024 bytes of space of Z000–Z0F, Z400–Z4FF, Z800–Z8FF and ZC00–ZCFF, where Z is the slot value. Thus the present invention provides access to 16,128 additional total bytes of input/output space over the existing prior art systems.

While this discussion has assumed that sixteen slots have been available, fewer slots, such as seven, need only be provided, with the remaining eight slots, 9–16, being considered as being on the system board, thus providing the system board even greater amounts of new input/output space. This could be accomplished by using a 3 to 8 decoder with the A15 bit being used as a chip enable signal to allow decoding.

The above extended yet backwardly compatible addressing system may be more fully illustrated by several specific examples. Suppose the central processing unit (CPU) of a computer system desires to send a character to the COM2 assigned locations of 2F8–2FF and the serial port circuit board is located in slot 1. This will be an input/output cycle, not a direct memory access cycle or a memory cycle. DMA line 52 will be low. I/O line 50 will be high. The serial port circuit board is a conventional circuit board that considers itself addressed if the seven bits A9–A3 of the address word are 1011111 so that an address of XXXXX1011111XXX is valid, where X indicates indifference toward whether it is a 1 or a 0. Because the A9 bit is high, the output of the existing circuit board AND gate 66 is low, so that all the AEN lines are low and the circuit board is correctly accessed.

Assume subsequently that the CPU wishes to drive a new, sophisticated video graphics display whose circuit board is designed to utilize the present invention. The circuit board is installed in slot 7, with the corresponding application software knowing this location. The CPU generates an address word 0111XX00XXXXXXXX to address a location of the display. The existing circuit board AND gate 66 indicates that both A9 and A8 are zero and generates a high on line 64. Again, the IO signal is high and the DMA signal is low. The decoder generates a low on decoder output line corresponding to slot 7 and highs on all other of its output lines. The above drives AEN high for all slot locations other than 7, thereby disabling the circuit boards in those slots. Only the circuit board in slot 7, the video graphics display device, will be permitted to interpret the address word from the CPU and respond to signals associated with that address word.

As a final example, assume that the CPU is addressing the first programmable interval timer at location 0040. The DMA signal is low and the IO signal is high. The existing circuit board AND gate 66 produces a high level output because the A8 and A9 address bits are low. The 0 output line of the decoder 70 goes low because the four high address bits are zero, with the remaining output lines being set at a high level. Therefore AEN0 is set low, enabling the system board devices, with the system board providing the further necessary address decoding.

As can be seen, the present invention allows the use of circuit boards which used only m bits for encoding, with the m bits being a portion of a larger n bit full address, and yet allows new circuit boards to be utilized when some p bits of the n bits used in the address are in a given state with a r bit wide portion of the remaining address lines utilized to select a given circuit board.

The foregoing disclosure and description of the invention are illustrative and explanatory thereof, and various changes in the size, shape, materials, components, circuit elements, wiring connections and contacts, as well as in the details of the illustrated circuitry, construction and method of operation may be made without departing from the spirit of the invention.

What is claimed is:

1. A system for addressing circuit boards interchangeably insertable into a plurality of slot locations within a computer system, the computer system having a system board including addressable devices and providing n bits of common circuit board addressing lines for input/output spaces, the addressing system being compatible with circuit boards utilizing a previous addressing system of interpreting no more than a lower m bits of the n addressing lines, with a given state of an upper p bits of the lower m bits indicating response by system board addressable devices and the other states of the p bits indicating response by a circuit board addressable device, where p is less than m which is less than n, the circuit boards further being responsive to a line for disabling the interpretation of addressing lines, the addressing system comprising:

means for determining the state of the upper p bits of the lower m bits of the n addressing lines;

means for determining the state of r bits of the n addressing lines where the r bits are higher than the lower m bits, wherein the r bits may indicate a slot location or the system board;

means for rendering the system board responsive to a line for disabling the interpretation of addressing lines and having an effective slot location; and means responsive to said p bits state determining means and said r bits state determining means for providing a disabling signal to the disabling line of a circuit board or the system board when the p bits are in the state previously indicating response by system board addressable devices and the r bits indicate other than the slot location of the circuit board or the system board.

2. The system of claim 1, wherein said disabling signal providing means includes means for providing a disabling signal to the disabling lines of all the circuit boards when the computer system is performing a direct memory access operation.

3. The system of claim 1, wherein said disabling signal providing means includes means for defeating providing of the disabling signal to any disabling line of a circuit board during a memory space operation.

4. The system of claim 1, wherein said disabling signal providing means includes means for allowing the providing of the disabling signal to the disabling line of a circuit board during an input/output space operation.

5. The system of claim 1, wherein said r bits state determining means includes a r to 2 r decoder having 2 output lines.

6. The system of claim 5, wherein said decoder produces a low level output on said output line corresponding to the value of said r bits and high level outputs on said output lines not corresponding to the value of said r bits.

7. The system of claim 1 wherein said disabling signal providing means includes an AND gate having an input from said p bits state determining means, an input from r bits state determining means and an output.

8. The system of claim 7, wherein said AND gate further has an input for receiving indication of an input-/output space operation in process.

9. The system of claim 8, further comprising an OR gate having one input coupled to said output of said AND gate and a second input coupled to a signal indicating a direct memory access operation in process.

10. The system of claim 1 when m is 10.

11. The system of claim 1 when p is 2.

12. The system of claim 1 when r is 4.

13. The system of claim 1 wherein m is 10 and p is 2 and r is 4.

* * * * *

UNITED STATES PATENT AND TRADEMARK OFFICE
CERTIFICATE OF CORRECTION

PATENT NO. : 4,999,805

DATED : March 12, 1991

INVENTOR(S) : Paul R. Culley, et al.

It is certified that error appears in the above-identified patent and that said Letters Patent is hereby corrected as shown below:

Title page:

In the Assignee, please replace "Compaa" with "Compaq".

Signed and Sealed this

Twenty-ninth Day of September, 1992

Attest:

DOUGLAS B. COMER

*Attesting Officer*   *Acting Commissioner of Patents and Trademarks*